(12) United States Patent
Heinz

(10) Patent No.: US 8,834,969 B2
(45) Date of Patent: Sep. 16, 2014

(54) METHOD FOR MANUFACTURING WORKPIECES AND APPARATUS

(75) Inventor: Bernd Heinz, Buchs (CH)

(73) Assignee: Oerlikon Advanced Technologies AG, Balzers (LI)

( * ) Notice: Subject to any disclaimer, the term of this patent is extended or adjusted under 35 U.S.C. 154(b) by 1103 days.

(21) Appl. No.: 12/256,543

(22) Filed: Oct. 23, 2008

(65) Prior Publication Data

US 2009/0106968 A1    Apr. 30, 2009

Related U.S. Application Data

(60) Provisional application No. 60/982,256, filed on Oct. 24, 2007.

(51) Int. Cl.
| | |
|---|---|
| *B05D 5/12* | (2006.01) |
| *B05D 3/00* | (2006.01) |
| *H01L 21/67* | (2006.01) |
| *H01L 21/677* | (2006.01) |
| *H01L 21/687* | (2006.01) |

(52) U.S. Cl.
CPC ..... *H01L 21/67184* (2013.01); *H01L 21/67751* (2013.01); *H01L 21/68764* (2013.01)
USPC ............................... 427/294; 427/74; 427/295

(58) Field of Classification Search
CPC ................... H01L 21/67184; H01L 21/67751; H01L 21/67748; H01L 21/67757; H01L 21/67754; H01L 21/68764; H01L 21/67727; H01L 21/68771

USPC ............................................ 427/74, 294, 295
See application file for complete search history.

(56) References Cited

U.S. PATENT DOCUMENTS

| | | | | |
|---|---|---|---|---|
| 4,313,254 | A | * | 2/1982 | Feldman et al. ................. 438/72 |
| 4,715,921 | A | | 12/1987 | Maher et al. |
| 5,090,900 | A | | 2/1992 | Rudolf et al. |
| 5,655,277 | A | | 8/1997 | Galdos et al. |
| 5,658,114 | A | | 8/1997 | Mahler |
| 6,007,675 | A | | 12/1999 | Toshima |
| 7,062,344 | B2 | * | 6/2006 | Yokoyama et al. ........... 700/112 |
| 2005/0282371 | A1 | | 12/2005 | Patton et al. |
| 2006/0054495 | A1 | | 3/2006 | Rohrmann et al. |

OTHER PUBLICATIONS

International Search Report for PCT/EP2008/064373 dated Jan. 21, 2009.
Written Opinion for PCT/EP2008/064373 dated Jan. 21, 2009.

* cited by examiner

*Primary Examiner* — Michael Wieczorek
(74) *Attorney, Agent, or Firm* — Pearne & Gordon LLP

(57) ABSTRACT

For vacuum treatment of workpieces by a multitude of distinct processing stations ($P_{11}$-$P_{1n}$, $P_{21}$-$P_{2m}$) the processing stations are grouped in two groups (I and II). The workpieces are handled towards and from the processing stations of the first group (I) simultaneously, whereat the workpieces are treated by the processing stations of the second group (II) in a selectable individual sequence.

9 Claims, 5 Drawing Sheets

METHOD FOR MANUFACTURING WORKPIECES AND APPARATUS

Figure 1:
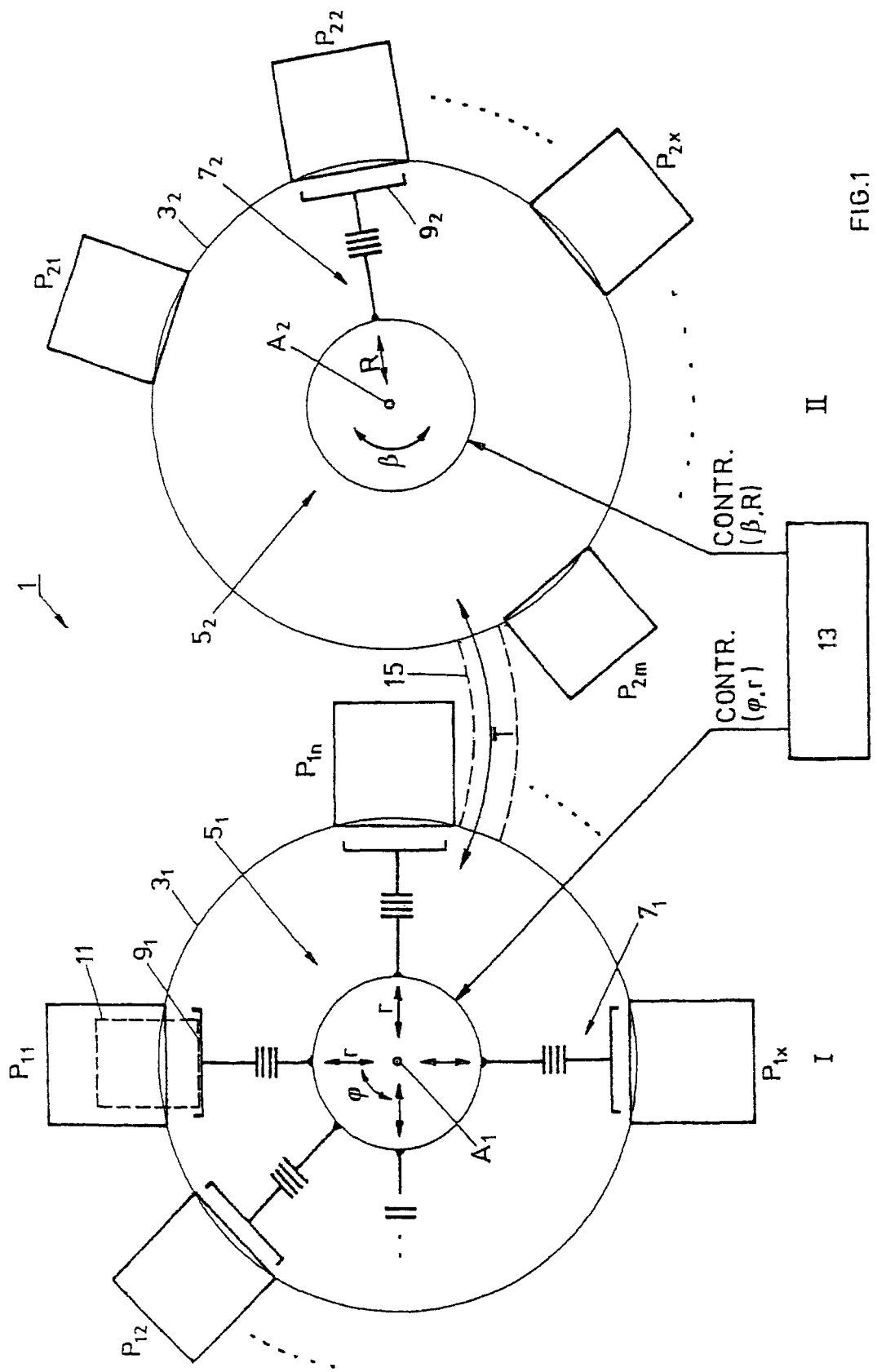

The present invention is directed to manufacturing of workpieces treated by a multitude of vacuum treatment processes, thereby especially to manufacturing of substrates like wafers, data storage disks or substrates for photovoltaic applications as for solar panel manufacturing e.g. coated glass substrates.

For the treatment of substrates in vacuum e.g. coating with a multitude of layers, heating, cooling, cleaning and etching, there exist a number of principles to transport the substrates through the assembly of evacuated processing stations without breaking the vacuum.

The US 2006/0054495 and the U.S. Pat. No. 5,658,114 show linear assemblies of vacuum processing stations. In the U.S. Pat. No. 5,655,277 vacuum processing stations are assembled in a circular configuration.

In both cases, i.e. linear and circular arrangements, one cycle of the overall processing can be subdivided in two types of steps, namely transporting steps and processing steps. Typically, all the substrates within the processing apparatus are transported simultaneously, i.e. parallel in time, from one processing station to the next one. The substrates are thereby passing all the stations in a well-defined sequence which is the same for all substrates being processed. The transport steps are followed by respective process steps, where the substrates are treated simultaneously by the vacuum processes in the respective vacuum processing stations.

A transport step of the substrates can only be started after all the processes in the respective vacuum process stations are completed. Thus, tact time of the overall apparatus is governed by the longest one of the processing time spans at the respective vacuum processing stations.

Such transport and processing in a parallel manner, i.e. simultaneously for substrates involved, is favorable for achieving a high throughput (number of treated substrates per time unit) if the processing time spans in the respective vacuum treatment stations do not differ too much from each other. The transport arrangement for serving the vacuum processing stations as well as the time control of such transport arrangement may be kept simple and thus the addressed processing principle is highly cost-efficient for manufacturing the addressed workpieces.

On the other hand it is an inherent disadvantage of this concept that the longest processing time span determines the overall cycle time of the apparatus. Especially in cases, where one of the individual processes takes substantially longer than the other processes, the addressed concept is inefficient due to the fact that the processing stations for the shorter processing time spans are used only during fraction of time of the overall cycle time, i.e. high dead times occur. Shorter processing time spans can not be exploited, due to blocking of the overall cycle time of the apparatus by longer processing time spans.

In some cases this problem may be overcome by using two or more identical vacuum processing stations consecutively to subdivide the processing time spans of those processings with longer processing time spans. It is, as an example, possible to deposit certain layers in two or more than two steps using a respective number of vacuum processing stations so as to adapt deposition time to shorter processing time spans in other processing stations. A longer processing time span for one processing is subdivided into multiple processing time spans with respective processings realized at subsequent processing stations. Thereby, the dead time of the overall apparatus can be minimized.

However, splitting of an individual process is not possible in all cases. As an example, deposition of very sensitive layers must be performed uninterruptedly in one and the same processing station.

Another basic approach to the problem as mentioned above is, according to a second principle, to serve by a transport arrangement processing stations individually. Loading workpieces as of substrates into a processing station and removing them therefrom is established in a sequential manner and processing the workpieces in the respective processing station is performed at least overlappingly in time and thus substantially simultaneously, i.e. in parallel. After one individual processing has finished, transport to a next processing is accomplished. By this principle, dead time as mentioned above can be minimized. The U.S. Pat. No. 4,715,921 shows an apparatus and processing according to the principle as just addressed. It is known as "cluster" arrangement having a circular arrangement of individual processing stations grouped around a central transport or handling chamber. By means of load/unload lock stations vacuum environment may be upheld in the central transport chamber.

According to the U.S. Pat. No. 5,090,900 a central evacuatable transport chamber is connected to a plurality of processing stations. In this case the substrates are transported sequentially and the overall system offers a high flexibility with respect to loading/unloading time of the individual process stations. However, the facts that one central transport arrangement has to perform all the movements and only one workpiece can be handled at a time result in that such system is not optimized for high throughput applications. Especially for a high number of different processing stations the handling, i.e. transport activity, becomes the bottleneck for system throughput.

Thus, both basic principles which may be abbreviated as "simultaneous transport" and "individual transport" have advantages and disadvantages as addressed above. Both principles lack flexibility with respect to optimized overall system or apparatus performance, especially in terms of throughput.

It is an object of the present invention to improve such methods for manufacturing workpieces and respective apparatus with respect to the addressed disadvantages, thereby maintaining the respective advantages.

To do so the method for manufacturing workpieces, each treated by a multitude of vacuum treatment processes according to the present invention, comprises
- providing a vacuum processing station for each of the vacuum processes;
- grouping the vacuum processing stations in at least a first group of such stations which perform, respectively, first vacuum treatment processes and in a second group of such processing stations which perform respectively second vacuum treatment processes.

Clearly, the first and second vacuum treatment processes include respectively different or equal processes.
- The first group of vacuum processes has, respectively, first processing time spans which are generically not equal, but may be equal, at least a part of these time spans may be equal.
- The second group of vacuum treatment processes has respective second processing time spans which generically are unequal. Nevertheless, at least a part of these second processing time spans may be equal.
- The first processing time spans are selected to be shorter than the second processing time spans.
- Each workpiece is vacuum treated consecutively by each of the addressed first vacuum processes and transporting the workpieces is thereby performed simultaneously from respective ones of the first processing stations to a next one of the first processing stations.

The workpieces are further treated by the second vacuum processes, whereby transporting the workpieces is performed individually to and from selected second processing stations.

Thus, and according to the invention the processing steps are subdivided in a first group with shorter processing time spans and a second group with longer processing time spans. The former group is operated according to the parallel transport principle as addressed above, the second group is operated by the individual transport principle.

In one embodiment of the method according to the present invention treating the workpieces by the second vacuum processes comprises simultaneously treating such workpieces by equal ones of the second vacuum treatment processes. Thereby, two or more workpieces are vacuum treated by equal processes which accords with parallel processing of such workpieces.

In a further embodiment of the method according to the invention the workpieces are transported from the first group of processing stations to the second group of processing stations or vice versa in vacuum.

Still in a further embodiment the sum of the first processing time spans is selected to be substantially equal to at least one of the second processing time spans. Thereby, the dead processing time is further minimized.

In a further embodiment the workpieces being manufactured are substrates.

In a further embodiment the workpieces being manufactured are semiconductor or storage device wafers.

Still in a further embodiment the workpieces as manufactured are substrates for photovoltaic applications, thereby especially for manufacturing solar panels.

The vacuum treatment apparatus according to the present invention and which provides for utmost processing flexibility, thereby optimizing processing cycle time, comprises
  a first group of first vacuum processing stations;
  a second group of second vacuum processing stations;
  wherein the first processing stations are served by a first workpiece transport arrangement which is conceived for transporting workpieces simultaneously from respective ones of the first processing stations to next ones of the first processing stations;
  the second processing stations being served by a second workpiece transport arrangement which is conceived for transporting workpieces individually to and from selected ones of the second processing stations.

Thereby, the addressed first workpiece transport arrangement establishes especially sealingly closing the first group of vacuum processing stations whenever the workpieces are transported into respective treatment positions in the addressed first vacuum processing stations.

Further, the addressed first workpiece transport arrangement may comprise receptacles for receiving the workpieces which are exchangeable, thereby may be automatically exchanged during operation of the vacuum treatment apparatus. By such receptacles parts of the transport arrangement which may become exposed to the treatment by the first vacuum processing stations and thereby contaminated may easily be exchanged for cleaning.

In one embodiment of the apparatus according to the present invention the first processing stations are circularly grouped about a first central vacuum transport station wherein the first workpiece transport arrangement operates. In a further embodiment of the apparatus according to the invention, which may be combined with the embodiment as just addressed above, the second processing stations are circularly grouped about a second vacuum transport chamber wherein the second workpiece transport arrangement operates.

In a further embodiment of the apparatus according to the invention, which may also be combined with any of the addressed embodiments, a further transport arrangement is provided which is conceived for transporting workpieces from the first group of processing stations to the second group of vacuum processing stations. In spite of the fact that such further transport arrangement may operate under ambient atmosphere conditions, in a further embodiment the addressed further transport arrangement is operating in vacuum.

Still in a further embodiment of the apparatus according to the invention, the just addressed further transport arrangement is realized by at least one of the first and of the second workpiece transport arrangements. Thus, handling of the workpieces from one group of processing stations to the other or vice versa may be performed by the first transport arrangement or by the second transport arrangement or the two transport arrangement may cooperate for such handling.

Still in a further embodiment of the apparatus according to the invention, which may be combined with any of the embodiments addressed above, at least two of the second vacuum processing stations are equal.

Still in a further embodiment of the apparatus according to the invention, which again may be combined with any one of the addressed embodiments, the first processing stations are conceived for performing first vacuum processes with respective first processing time spans. Thereby, these first processing time spans may generically all be different, whereby at least part of these time spans may also be equal. The second processing stations of this embodiment are conceived for performing second vacuum processes with respective second processing time spans. Again generically, these second processing time spans may be different, whereby at least a part of these second processing time spans may be equal. According to this embodiment the first processing time spans are shorter than the second processing time spans.

In one variant of the just addressed embodiments the sum of the first processing time spans is selected substantially equal to at least one of the second processing time spans.

Still in a further embodiment of the apparatus according to the invention, which may be combined with all embodiment addressed, the workpieces are wafers, thereby especially wafers for manufacturing semiconductor devices, storage devices or photovoltaic devices. In a further embodiment the addressed workpieces are substrates for solar panels.

Figure 2:
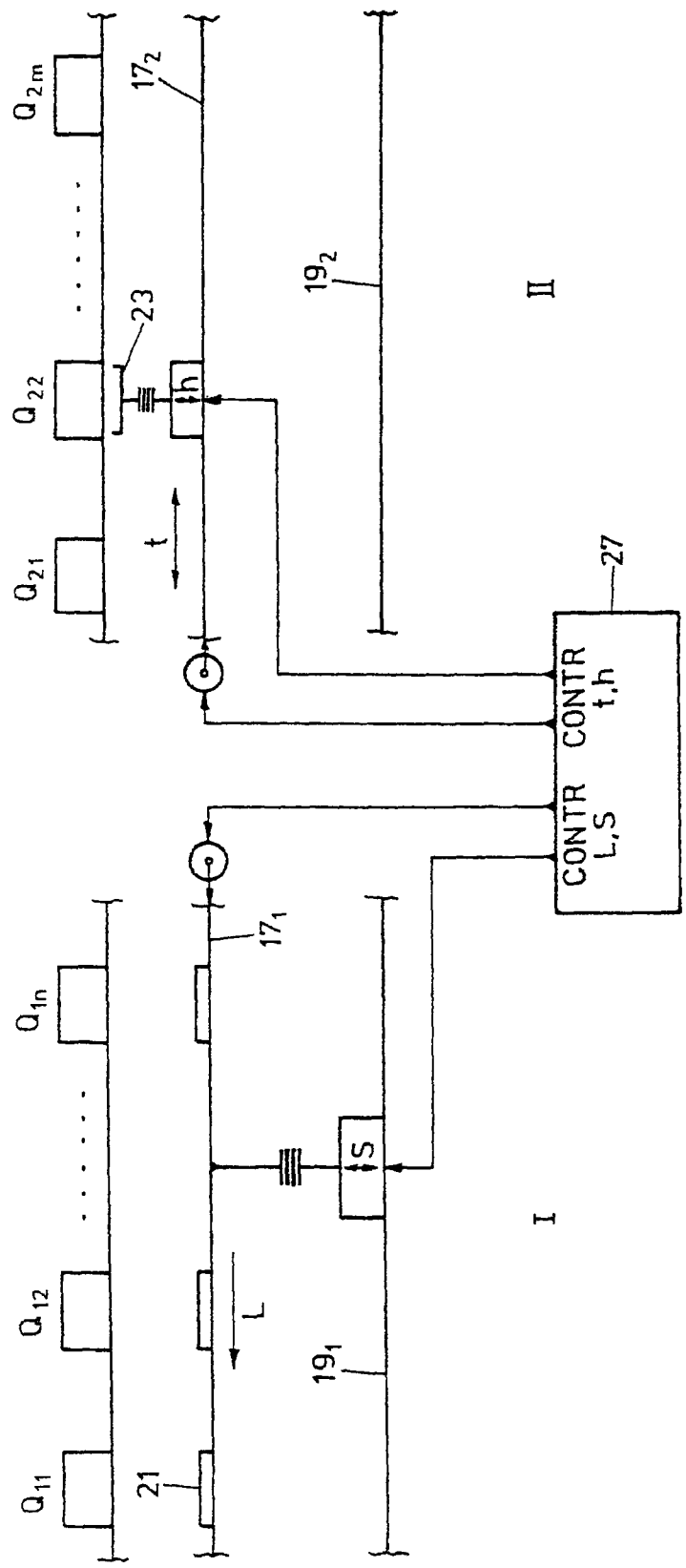
Figure 3:
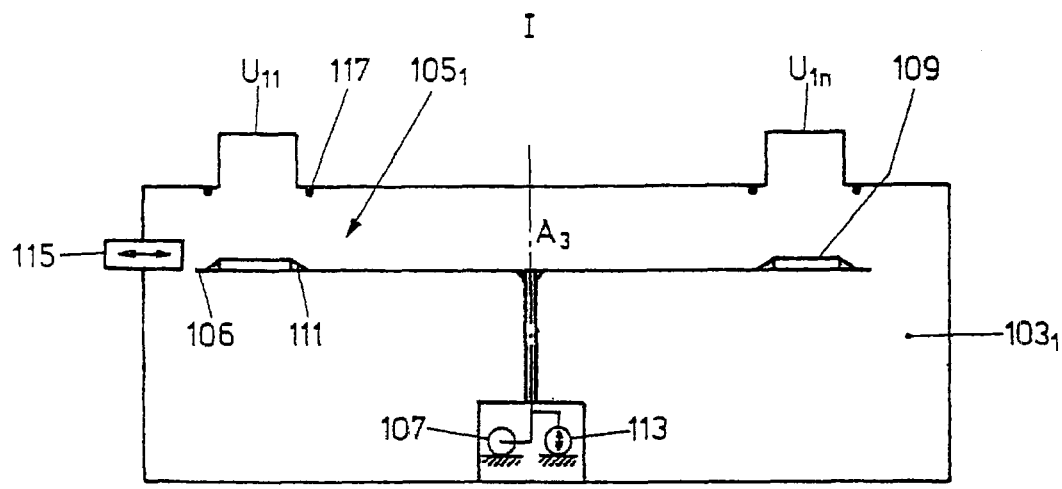
Figure 4:
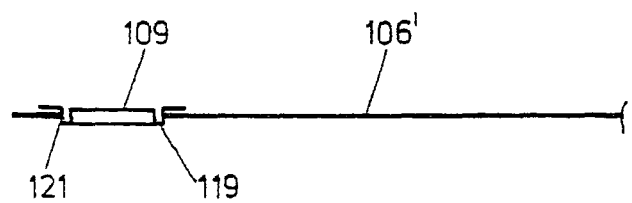
Figure 5:
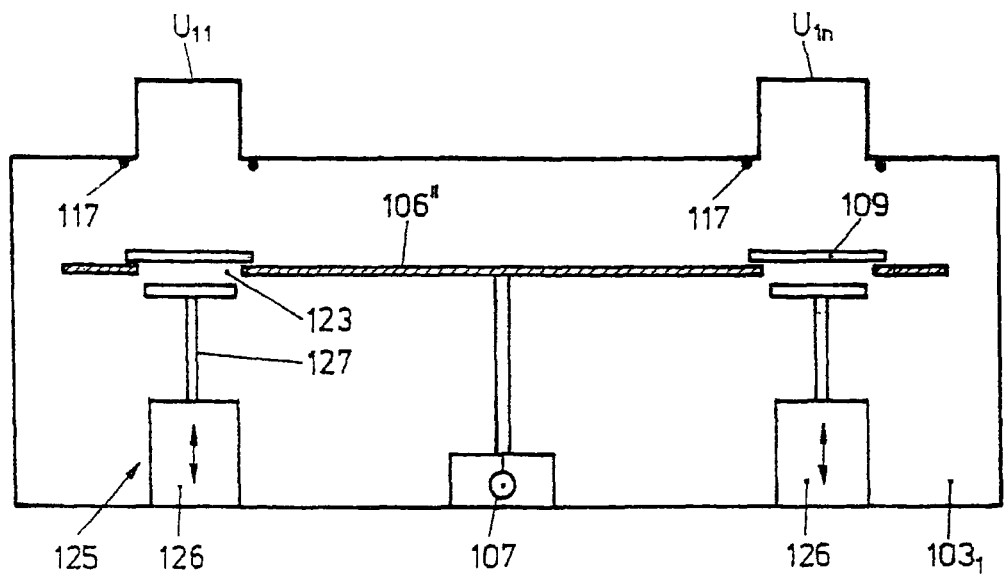
Figure 6:
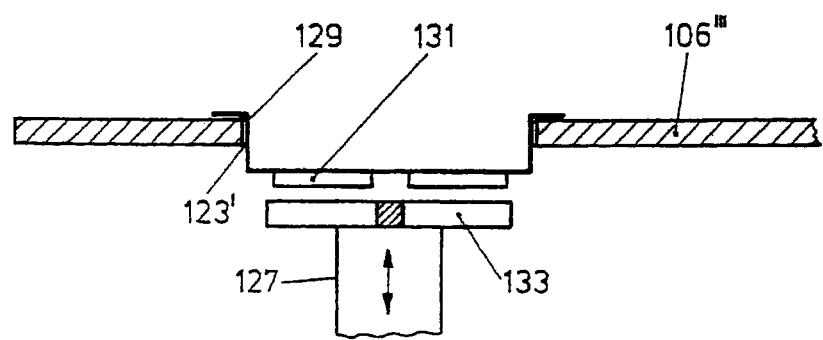
Figure 7:
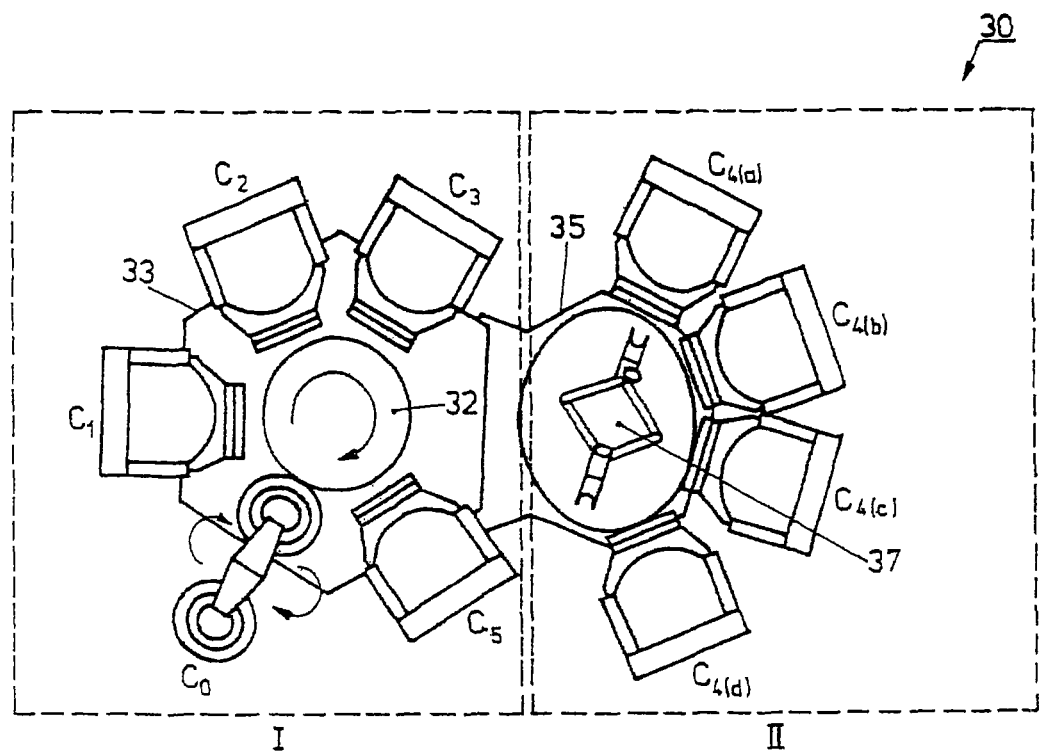
Figure 8:
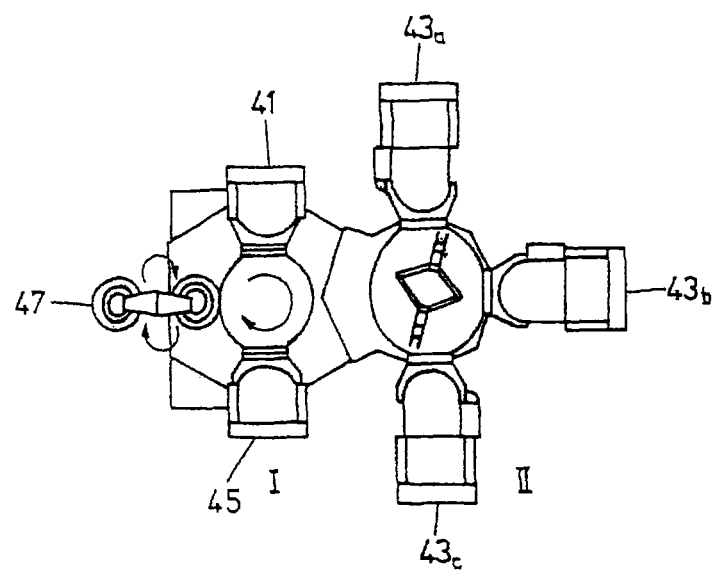

The invention shall now be further explained by means of examples and with the help of figures. The figures show:

FIG. 1 schematically and in top view, a vacuum treatment apparatus according to the present invention and residing on rotational transport of workpieces, thereby performing the method for manufacturing according to the invention;

FIG. 2 schematically and in a side aberration view, a vacuum treatment apparatus according to the present invention and residing on linear or "inline" workpiece transportation and performing the method according to the invention;

FIG. 3 schematically and in a lateral view, a further embodiment of a group I processing arrangement as may be provided in the embodiment of the apparatus and method according to the invention of FIG. 1;

FIG. 4 schematically and in lateral view, a part of a transport table in a further embodiment and as may be provided in each of the embodiments according to FIG. 1-3;

FIG. 5 in a representation in analogy to that of FIG. 3, a further embodiment of the arrangement as of FIG. 3;

FIG. 6 in a representation in analogy to that of FIG. 4, the embodiment of FIG. 4 adapted to be applied and operated in the embodiment as of FIG. 5;

FIG. 7 in a simplified and schematic top representation, a further embodiment of the apparatus according to the present invention and operating the method according to the invention, and FIG. 8 in a simplified and schematic top representation in analogy to that of FIG. 7, a further embodiment of the apparatus according to the present invention operating according to the method of the present invention.

In FIG. 1 there is schematically shown a vacuum processing apparatus according to the present invention to be operated for the method according to the invention. An apparatus 1 according to the present invention comprises a multitude of processing stations $P_{11}$ to $P_{1n}$, $P_{21}$ to $P_{2m}$. First processing stations $P_{11}$ to $P_{1n}$ are circularly grouped about a first vacuum transport chamber $3_1$, thereby forming a first group I. Within the first vacuum transport chamber $3_1$ there operates a first transport arrangement $5_1$. The transport arrangement $5_1$ is drivingly rotatable—ϕ—about a central axis $A_1$ within vacuum transport chamber $3_1$. As an exemplary realization form the transport arrangement $5_1$ comprises a number of radially extending transport arms $7_1$ being simultaneously drivingly and controllably extendable and retractable in radial direction as schematized by the common radial drive r. Each transport arm $7_1$ carries at its end remote from axis $A_1$ a workpiece support 9. As was addressed all transport arms $7_1$ are controlled with respect to their extension and retraction by drive r in synchronism. The overall transport arrangement $5_1$ is rotatable about axis $A_1$ in a controlled manner and in the direction ϕ.

Thus, workpieces as schematically shown in dashed line at 11, are simultaneously gripped by the respective workpiece supports 9 of the transport arms $7_1$, are simultaneously retracted from the respective first processing stations $P_{11}$ to $P_{1n}$. Thereafter, the transport arrangement $5_1$ is rotated in direction ϕ to bring the workpieces 11 in alignment with the next processing stations considered in direction ϕ. There, the workpieces are simultaneously applied to the respective first processing stations $P_{11}$ to $P_{1n}$ by simultaneously extending the transport arms $7_1$. Thus, the first group I of processing stations $P_{11}$ to $P_{1n}$ is served by the first transport arrangement $5_1$ simultaneously, and in a predetermined sequence. Rotation of the first transport arrangement $5_1$ about axis $A_1$ as well as simultaneous extension and retraction of the transport arms $7_1$ is time-controlled as schematically shown in FIG. 1 by means of a time controller unit 13 at CONTR. (ϕ, r).

A second group II of processing stations $P_{21}$ to $P_{2m}$ is grouped circularly along a second vacuum transport chamber $3_2$. The processing stations $P_{21}$ to $P_{2m}$ of this second group II are served by a second transport arrangement $5_2$ which is drivingly and controllably rotatable about central axis $A_2$ of vacuum transport chamber $3_2$ forth and back in both directions, as indicated by the double-arrow β. The second transport arrangement $5_2$ comprises one or possibly more than one transport arms $7_2$ which may individually be radially extended and retracted as shown by drive R. If more than one transport arms $7_2$ are provided, they are controllably extendable and retractable in mutual independency. The transport arm $7_2$ comprises a workpiece support 92 at its end opposite to axis $A_2$.

Thus, the processing stations $P_{21}$ to $P_{2m}$ of the second group II are served by the second transport arrangement $7_2$ individually in opposition to serving the processing stations $P_{11}$ to $P_{1n}$ of the first group I by first transport arrangement $5_1$ which is performed simultaneously and in a predetermined sequence. Rotational control of the second transport arrangement $7_2$ as well as extension and retraction of its at least one transport arm $7_2$ is controlled by a time control unit as e.g. the time control unit 13, as shown by contr. β, R.

Clearly, there is provided at least one input loadlock for workpieces to either the first group I of processing stations or to the second group II of processing stations and at least one output loadlock for workpieces from either the first group I or from the second group II. As was addressed, the overall apparatus according to the present invention comprises both groups I and II of processing stations. A further transport T for workpieces from the first group I of processing stations to the second group II of processing stations is schematically shown in FIG. 1 by the double-arrow T. Most generically, this further transport arrangement T may operate via respective loadlocks in the vacuum transport chambers $3_1$ and $3_2$ via ambient atmosphere, or may, as shown in dash line at 15, be performed in vacuum. The provision of respective input, output or input/output loadlocks at the respective vacuum transport chambers $3_1$ and $3_2$ is not shown in FIG. 1.

It becomes clear from FIG. 1 that the apparatus according to the present invention combines two handling or transport principles, namely in group I as indicated in FIG. 1, where workpieces are simultaneously transported from one to the next processing station and according to group II according to FIG. 1, where workpieces are individually transported towards and from processing stations.

In FIG. 2 this principle is shown in an apparatus according to the present invention, which resides on linear workpiece transportation. Processing stations $Q_{11}$ to $Q_{1n}$ of a first group I of processing stations arranged along a first vacuum transport chamber $19_1$ are served by a first transport arrangement $17_1$ which is controllably and drivingly linearly movable in one direction as shown by the arrow L along the processing stations $Q_{11}$ to $Q_{1n}$. As most schematically shown in FIG. 2 by drive S the linear conveyor $17_1$ is controllably movable towards and from the processing stations $Q_{11}$ to $Q_{1n}$ so that all the processing stations are simultaneously served with workpieces 21. Thus, in perfect analogy to the processing stations of group I in FIG. 1 the processing stations $Q_{11}$ to $Q_{1n}$ of group I of FIG. 2 are simultaneously served by conveyor arrangement $17_1$ with workpieces in a predetermined sequence established by conveying direction L.

The second processing stations $Q_{21}$, $Q_{22}$ to $Q_{2m}$ linearly arranged along second vacuum transport chamber $19_2$ are served by a second transport arrangement $17_2$ which is linearly movable forth and back in a controlled driven manner as shown by the double-arrow t and which comprises at least one workpiece support 23 which is individually liftable and retractable towards and from the processing stations $Q_{21}$ to $Q_{2n}$ of the second group II as schematically shown by the double-arrow drive h. Thus, the second group II as of FIG. 2 is served in perfect analogy with the second group II of FIG. 1. As schematically also shown in FIG. 2 time control of the linear conveyor movements L and l as well as up and down movements of the workpiece holders towards and from the respective processing station is controlled by a time control unit 27.

What was explained with respect to the further transport arrangement T as well as with respect to input, output and possibly input/output loadlocks for workpieces to the overall apparatus we refer to the respective explanations in context with the embodiment of FIG. 1 which are also valid for the linear concept as of FIG. 2.

In both embodiments of the apparatus according to the present invention and as most schematically shown in the FIGS. 1 and 2 the group I with the respective transporting of workpieces simultaneously towards and from the processing stations $P_{11}$ to $P_{1n}$ in a predetermined sequence is exploited for processing stations at which workpiece processing is performed during respective first processing time spans which are shorter than respective processing time spans as necessitated by processes in the processing stations $P_{21}$ to $P_{2m}$ of group II. The same is valid with respect to group I and group II according to the linear concept of FIG. 2. Thereby and if at all possible for a specific overall processing of the workpieces the sum of the processing time spans along group I is selected to be at least substantially equal to at least one processing time span of a processing station of group II. Further, two or more than two of the processing stations of group II are selected to be equal, so that in group II real parallel processing with equal processes is performed.

In FIG. 3 there is schematically shown a further embodiment of the group I arrangement. In this embodiment the first transport arrangement $105_1$ comprises a transport table 106 which is rotatably drivable about an axis $A_3$ by means of a controllable rotation drive 107. Workpieces as e.g. wafers 109 are deposited along the periphery of transport table 106 along a circular locus and are held in position by respective holders 111 on table 106. A multitude of first processing stations $U_{11}$-$U_{1n}$ is provided in a circular arrangement about axis $A_3$ at the first vacuum transport chamber $103_1$ with a radial distance from axis $A_3$ which accords with the radial distance from the addressed axis $A_3$ with which the workpieces 109 are deposited in a circular fashion about axis $A_3$ on table 106. By means of a linear up/down drive 113 the transport table 106 may controllably be lifted up towards the first processing stations $U_{11}$-$U_{1n}$ and respectively retracted therefrom. In operation the workpieces 109 are loaded via a respective loadlocking arrangement 115 with respective transport robots onto the transport table 106. The first processing chambers $U_{11}$-$U_{1n}$, as was addressed circularly grouped about axis $A_3$, and the workpieces 109 circularly grouped as well about axis $A_3$, are angularly positioned about axis $A_3$ so that all the workpieces 109 may simultaneously be brought in alignment with respective ones of the first processing stations $U_{11}$-$U_{1n}$ by respective rotational steps and driven by rotation drive 107.

In operation all the workpieces 109 deposited on the transport table 106 are simultaneously brought in alignment, each with one of the processing stations $U_{11}$-$U_{1n}$ by means of a controlled rotation drive 107. Then the transport table 106 is lifted by the linear lifting drive 113 in a controlled manner up to all the workpieces 109 being positioned within the or adjacent to the respective first processing stations in treatment position. As schematically shown by the sealing members 117, whenever, by the addressed lifting operation of the transport table 106, the workpieces 109 are located in treatment positions, there is established closing of at least a part of the first processing stations $U_{11}$-$U_{1n}$ towards the vacuum transport chamber $103_1$. Such closing may be of desired degree up to establishing vacuum seal. Such closing is further established by cooperation of the border of the processing stations $U_{11}$-$U_{1n}$ as by the sealing members 117 with the area of the transport table 106 just along and adjacent to the workpieces 109 or by cooperation of the addressed border area of the processing stations with the workpieces 109 themselves or by respective cooperation of the border area of the processing stations with respective holders 111 at the transport table 106. After the workpieces 109 have been all treated in their momentarily attributed processing stations $U_{11}$-$U_{1n}$, by means of the linear drive 113 the transport table 106 with the yet treated workpieces 109 is retracted, is rotated by means of the rotation drive 107 by a predetermined angle so as to bring all the workpieces 109 into alignment with respectively next processing stations $U_{11}$-$U_{1n}$.

Thus, by the group I arrangement as shown in FIG. 3 again all workpieces are simultaneously transported and brought into respective treatment positions at respective ones of the first processing stations as was already explained in context with the embodiment of FIG. 1 as well as with the embodiment of FIG. 2.

In one variant of the embodiment as of FIG. 3 and as schematically shown in FIG. 4 the holders 111 as of FIG. 3 are realized by receptacles 119 which are removably and replaceably introduced into respective openings 121 in transport table 106'. The receptacles 119 are easily removable and re-applicable to the transport table 106', are e.g. just deposited in the addressed openings 121 for positioning and holding the workpieces 109. In this embodiment the addressed closing of the first processing stations $U_{11}$-$U_{1n}$ towards the vacuum transport chamber 103, as of FIG. 3, especially if realized as a vacuum seal, is performed by cooperation of the border or rim area of the first processing stations $U_{11}$-$U_{1n}$ as e.g. by means of the sealing members 117 with the border or rim area of the receptacles 119. At least parts of the overall transport table 106' are exposed to the respective treatments in the first processing stations $U_{11}$-$U_{1n}$. Thus, providing receptacles 119 as in the variant of FIG. 4 allows to easily exchange those parts at the transport table 106' which are most exposed to the treatment effect by the addressed processing stations. Thereby, these parts, i.e. the receptacles 119, may easily be replaced and cleaned outside the treatment apparatus and may be reapplied instead of cleaning at least the addressed areas or parts of the transport table. Thereby, considerable savings are reached with respect to time spans during which the overall apparatus is inoperative due to cleaning operations to be performed.

Especially if a closing or separation of processing atmospheres of the first processing stations $U_{11}$-$U_{1n}$ with respect to the vacuum atmosphere within the vacuum transport chamber $103_1$ is established by means of cooperating surfaces on one hand along the border of the processing stations and on the other hand along the border or rim of the receptacles 119 as was addressed, it becomes possible to ensure such closing to be continuously guaranteed by frequent cleaning of the receptacles 119 without or at least without substantial standstill time spans of the apparatus. Standstill time spans for such cleaning operations of the addressed areas are practically completely avoided if the receptacles 119 are automatically removed from the transport table 106' and are automatically reapplied during ongoing operation of the arrangement, which may be performed, as perfectly known to the skilled artisan, by removing and re-introducing the addressed receptacles 119 similarly to workpies 109 via a respective loadlock arrangement with a respective handling robot and by providing respective magazines for cleaned and yet uncleaned receptacles 119 outside the vacuum transport chamber $103_1$.

In FIG. 5 there is shown schematically and in a representation in analogy to that of FIG. 3 a further embodiment of the group I arrangement. As clear to the skilled artisan having read the explanations with respect to the embodiments of FIGS. 3 and 4, the difference of the embodiment according to FIG. 5 to that of FIG. 3 is that in the FIG. 5 embodiment the transport table 106 is rotatable by the controlled drive 107, but is not liftable by a linear lifting drive 113 as in the embodiment of FIG. 3. Instead, the transport table 106" comprises openings 123 similar to the openings 121 which were explained in context with FIG. 4. The openings 123 are nevertheless smaller than the dimension of the workpieces 109 so that latter may be deposited upon the addressed openings 123 as schematically shown. Lifting of the workpieces 109 towards and back from the first processing stations $U_{11}$-$U_{1n}$ is performed by respective lifting arrangements 125 which are mounted to the vacuum transport chamber $103_1$. Each lifting arrangement 125 comprises a controlled lifting drive 126 and an elevator member 127 which is controllably moved up and down by the controlled lifting drive 126. The elevator members 127 respectively are lifted towards the workpieces 109 through the opening 123 in transport table 106" and lift the workpieces 109 into treatment positions within the first processing stations $U_{11}$-$U_{1n}$.

The lifting drives 126 are operated substantially in synchronism to substantially simultaneously lift or retreat the workpieces 109. By respective rotation of the transport table 106" the workpieces 109 are brought in alignment with the lifting arrangements 125 on one hand and the respective first processing stations on the other hand.

Especially for the embodiment of FIG. 5 the concept of supporting and transporting the workpieces by receptacles as was addressed in context with FIG. 4 brings up additional advantages. This shall be explained with the help of FIG. 6. According to FIG. 6 and in comparison with the embodiment of FIG. 5 the openings 123' within transport table 106''' are slightly larger than the dimensions of the respective workpieces. In the openings 123' there are respectively applied receptacles 129 as was explained in context with FIG. 4 for the receptacles 119. According to FIG. 6 the receptacles 129 comprise, facing the lifting arrangements 125 with the elevators 127, guiding members 131 which match with respective members 133 at the top end of the elevators 127. Thus, there is established by mutual linear movement an accurate mutual positioning and fixation between the receptacles 129 and the elevators 127 during lift up and retraction of the workpieces 109 towards and from their treatment positions within the first processing stations $U_{11}$-$U_{1n}$ according to FIG. 5.

Clearly and with respect to cleaning as well as closing, i.e. separating processing atmospheres of the first processing stations from the vacuum atmosphere within the transport chamber, the receptacles 129 according to the embodiment of FIG. 6 have additionally the same advantages as were already addressed in context with receptacle 119 of the embodiment of FIG. 4.

The skilled artisan is now aware of the multitude of optimized options for process grouping and respective time control of the overall apparatus comprising the at least two processing groups I and II with their respective transport arrangements built up according to the two addressed principles.

In FIG. 7 a further embodiment of the apparatus according to the present invention operated according to the method according to the invention is shown. The overall apparatus or system 30 again comprises a group I assembly and a group II assembly as was principally exemplified in context with FIG. 1 to 6. Group I assembly comprises first processing stations $C_1$ to $C_5$ and an input/output loadlock station $C_0$. A first transport arrangement 32 operates in vacuum transport chamber 33 and is conceived as was already addressed for simultaneously serving the processing stations $C_1$ to $C_5$ as well as loadlock station $C_0$. The Group II comprises the second processing stations $C_{4(a)}$ to $C_{4(d)}$. In this specific example the second processing stations $C_{4(a)}$ to $C_{4(d)}$ are identical. The second group II assembly comprises within vacuum transport chamber 35 the second transport arrangement 37 conceived to individually serve the second processing stations $C_4$. In this example the second transport arrangement 37 is further conceived to grip the workpieces from the first transport arrangement 32 and to thus realize the further transport T as was shown in FIG. 1 operating in vacuum. Clearly instead of performing the addressed transition function from group I to group II or vice versa by second transporting arrangement 37, it is also possible to perform this function by respective conception of the first transport arrangement 32. Still in another manner of realizing the addressed further transport between the groups I and II both transport arrangements 32 and 37 may cooperate with respect to transport movement.

Further, it is absolutely possible to separate the vacuum atmosphere of vacuum transport chamber 33 from the vacuum atmosphere in vacuum transport chamber 35 by applying in between a loadlock arrangement for transiting the workpieces from one group to the other. Further, it is also possible to provide as was already addressed in context with the FIGS. 1 and 2 a separate transport arrangement to perform transition from group I assembly to group II assembly, thereby additionally providing for a buffering station for the workpieces. Further, more than one group I assembly and/or group II assembly may be combined to establish a network-like arrangement of processing stations so as to optimize the overall processing cycle.

In the specific embodiments as shown in FIG. 7 the number of fast processings in the stations $C_1$ to $C_5$ may be said to be decoupled from the significant longer lasting processes at stations $C_4$, whereby a number of identical process stations $C_4$ is applied. Principally, the number of slow process stations $C_4$ is determined optimally by the ratio of overall cycle time in the group I assembly and processing time span of a process in a $C_4$ station.

In FIG. 8 there is schematically shown a further embodiment of an apparatus according to the present invention operated according to the method according to the invention. This embodiment is specifically tailored for manufacturing of heterojunction solar cell panels. In a first processing station 41 of group I assembly, heating of the substrate is performed. After heating the substrate is transported to group II processing. There parallel processing is performed at three second processing stations $43_a$ to $43_c$ by depositing a layer of amorphous hydrogenised silicon. Then the substrates are fed back to the group I assembly, where in a first processing station 45 there is deposited an indium tin oxide layer. Then the substrates are dispatched to ambient via loadlock station 47. The heating in station 41 as well as the ITO layer deposition in station 45 may be done within typically 20 sec. The deposition of the amorphous hydrogenised silicon requires approx. 60 sec. Thus, wafer processing in the group I assembly including passing through the loadlock station 47 has a cycle time which is substantially equal to the processing time span in each of the second processing stations $43_a$ to $43_c$. Thereby in fact group I processing may be considered as one overall process which is of equal processing time span to each of the processings in the second group II assembly. Therefore, an overall apparatus is in fact realized whereat workpiece processing is established in processing steps of equal processing time spans, the processing in group I assembly being considered as one processing step.

The invention claimed is:

1. A method for manufacturing workpieces, each treated by a multitude of vacuum treatment processes comprising:
   providing a vacuum processing station for each of said vacuum treatment processes;
   grouping said vacuum processing stations in at least a first group of first vacuum processing stations performing respectively first vacuum treatment processes around a first central vacuum transport station and in a second group of second vacuum processing stations performing respectively second vacuum treatment processes around a second vacuum transport chamber;

treating each workpiece consecutively by each of said first vacuum treatment processes and transporting said workpieces simultaneously from one of said first vacuum processing stations to a next of said first vacuum processing stations; wherein each workpiece residing exposed to each of said first vacuum processing stations for first processing time spans of equal lengths;

transporting said workpieces between said first group of said first vacuum treatment processes and said second group of second vacuum treatment processes;

treating said workpieces by said second vacuum treatment processes, and transporting said workpieces individually to and from selected second vacuum processing stations, whereby one of said workpieces residing exposed to one of said second vacuum processing stations while a second one of said workpieces being transported to another of said second vacuum processing stations; and a second processing time span during which said one workpiece being exposed to said one of said second vacuum processing stations being longer than said first processing time spans.

2. The method of claim 1, wherein said treating workpieces by said second vacuum treatment processes comprises simultaneously treating workpieces by equal ones of said second vacuum treatment processes.

3. The method of claim 1 or 2, further comprising transporting said workpieces from said first group of vacuum processing stations to said second group of second vacuum processing stations or vice versa in vacuum.

4. The method of claim 3, wherein the sum of said first processing time spans is selected to be substantially equal to at least one of said second processing time spans.

5. The method of claim 1 or 2, wherein the sum of said first processing time spans is selected to be substantially equal to at least one of said second processing time spans.

6. The method of claim 1, said workpieces being substrates.

7. The method of claim 1, wherein said workpieces are semiconductor or storage device wafers.

8. The method of claim 1 or 2, wherein said workpieces are substrates adapted for photovoltaic applications.

9. The method of claim 8, wherein said substrates are adapted for manufacturing solar panels.

* * * * *

UNITED STATES PATENT AND TRADEMARK OFFICE
CERTIFICATE OF CORRECTION

PATENT NO. : 8,834,969 B2  
APPLICATION NO. : 12/256543  
DATED : September 16, 2014  
INVENTOR(S) : Bernd Heinz Page 1 of 1

It is certified that error appears in the above-identified patent and that said Letters Patent is hereby corrected as shown below:

In the specification,

Column 5, line 62, "92" should read -- $9_2$ --

Signed and Sealed this  
Third Day of March, 2015

Michelle K. Lee  
*Deputy Director of the United States Patent and Trademark Office*